(12) United States Patent
Hiramatsu et al.

(10) Patent No.: US 7,514,782 B2
(45) Date of Patent: Apr. 7, 2009

(54) SEMICONDUCTOR DEVICE

(75) Inventors: Seiki Hiramatsu, Tokyo (JP); Kei Yamamoto, Tokyo (JP); Atsuko Fujino, Tokyo (JP); Hiromi Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 78 days.

(21) Appl. No.: 11/697,094

(22) Filed: Apr. 5, 2007

(65) Prior Publication Data

US 2007/0241450 A1     Oct. 18, 2007

(30) Foreign Application Priority Data

Apr. 17, 2006   (JP)   .............................. 2006-113187
Mar. 27, 2007   (JP)   .............................. 2007-081590

(51) Int. Cl.
*H01L 23/373*   (2006.01)

(52) U.S. Cl. ...................... 257/703; 257/706; 257/707; 257/713; 257/720; 257/E23.113

(58) Field of Classification Search ................ 257/703, 257/706, 707, 713, 720, E23.113
See application file for complete search history.

(56) References Cited

U.S. PATENT DOCUMENTS 5,293,301 A  *  3/1994  Tanaka et al. ............... 361/707
5,305,186 A  *  4/1994  Appelt et al. ............... 361/704
6,690,087 B2 *  2/2004  Kobayashi et al. .......... 257/686
7,339,281 B2 *  3/2008  Usui et al. ................... 257/795

FOREIGN PATENT DOCUMENTS

| JP | 9-314747    | 12/1997 |
| JP | 10-41453    | 2/1998  |
| JP | 2003-110069 | 4/2003  |
| JP | 2005-64168  | 3/2005  |

* cited by examiner

*Primary Examiner*—Victor A Mandala
(74) *Attorney, Agent, or Firm*—Oblon, Spivak, McClelland, Maier & Neustadt, P.C.

(57) ABSTRACT

An objective is to provide a reliability-improved semiconductor device in which heat radiation characteristics are superior, and warpage of the semiconductor device occurring due to heat generation of a semiconductor chip or to varying of the usage environment is also suppressed. The semiconductor device is provided that includes a thermal-conductive sheet 3 formed on a base board 4, including thermal-conductive resin 6, a heat sink 2 provided on the base board 4 through the thermal-conductive sheet 3, a semiconductor chip 1 mounted on the heat sink 2, and a ceramic-embedded region 31 selectively provided in a region of the thermal-conductive sheet 3 under the semiconductor chip 1, including a ceramic component 5. In this semiconductor device, superior thermal conductivity can be ensured, and warpage and peeling in the semiconductor device occurring due to heat generation of the semiconductor chip or to varying of the usage environment can also be reduced.

11 Claims, 9 Drawing Sheets

SEMICONDUCTOR DEVICE

BACKGROUND OF THE INVENTION

1. Field of the Invention

The present invention relates to a semiconductor device using a thermal-conductive sheet for radiating heat from a semiconductor chip.

2. Description of the Related Art

A conventional semiconductor device, for example, as disclosed in Japanese Laid-Open Patent Publication No. 2005-64168 (Patent Document 1), includes a metal-base circuit substrate in which a circuit including a highly heat-generating electrical part (semiconductor chip) is formed on a metal-base board through a highly thermal-conductive insulating layer (thermal-conductive sheet); here, in the substrate, ceramic particles are filled as highly thermal-conductive fillers into resin. In this semiconductor device, the metal-base board and the circuit are united with each other; thus, the device is configured to conduct heat from the highly heat-generating electrical part into the metal-base board.

Moreover, a conventional semiconductor device, for example, as disclosed in Japanese Laid-Open Patent Publication No. 1997-314747 (Patent Document 2), includes a composite ceramic sheet (thermal-conductive sheet) that is produced by disposing ceramic pieces (ceramic laminae) inside a polymer film, and that is made to utilize the thermal and electrical functions of the ceramic, and also to have flexibility; thus, heat from a heat source is conducted to a heat radiator through the ceramic pieces.

However, in the highly thermal-conductive insulating layer disclosed in patent Document 1, because resin whose thermal conductivity is relatively low intervenes between the thermal-conductive ceramic particles, thermally conductive paths are omni-directionally broken, and improvement of the thermal conductivity is limited by the condition. Accordingly, in order to improve the thermal conductivity, when the ceramic particles have been highly filled, a problem has occurred that the adhesion characteristics decrease.

Moreover, when the composite ceramic sheet disclosed in Patent Document 2 is placed between a metal heat sink provided with a semiconductor chip and a metal base board, caused by the difference in linear-expansion coefficients between the ceramic piece and the heat sink or base board, a warpage generates in the semiconductor device, and peeling of the heat sink or breaking of the ceramic piece generates; consequently, a problem has occurred that the reliability of the semiconductor device decreases.

SUMMARY OF THE INVENTION

An objective of the present invention is to provide a semiconductor device in which heat radiation characteristics are superior, and warpage of the semiconductor device occurring due to heat generation of a semiconductor chip or to varying of the usage environment can also be suppressed.

According to the present invention, a semiconductor device is provided that includes a base board, a thermal-conductive sheet formed on the base board, including thermal-conductive resin, a heat sink provided on the base board through the thermal-conductive sheet, a semiconductor chip mounted on the heat sink, and a ceramic-embedded region selectively provided in a region of the thermal-conductive sheet under the semiconductor chip, including a ceramic component.

In such semiconductor device, the thermal-conductive sheet is configured of a region in which ceramic laminae are embedded and a region in which ceramic laminae are not embedded, and thus the semiconductor chip is mounted onto the ceramic-embedded region; therefore, superior thermal conductivity can be ensured, and warpage and peeling in the semiconductor device occurring due to heat generation of the semiconductor chip or to varying of the usage environment can also be reduced.

DETAILED DESCRIPTION OF THE PREFERRED EMBODIMENTS

Hereinafter, Embodiments according to the present invention are explained referring to figures.

Embodiment 1

Figure 1:
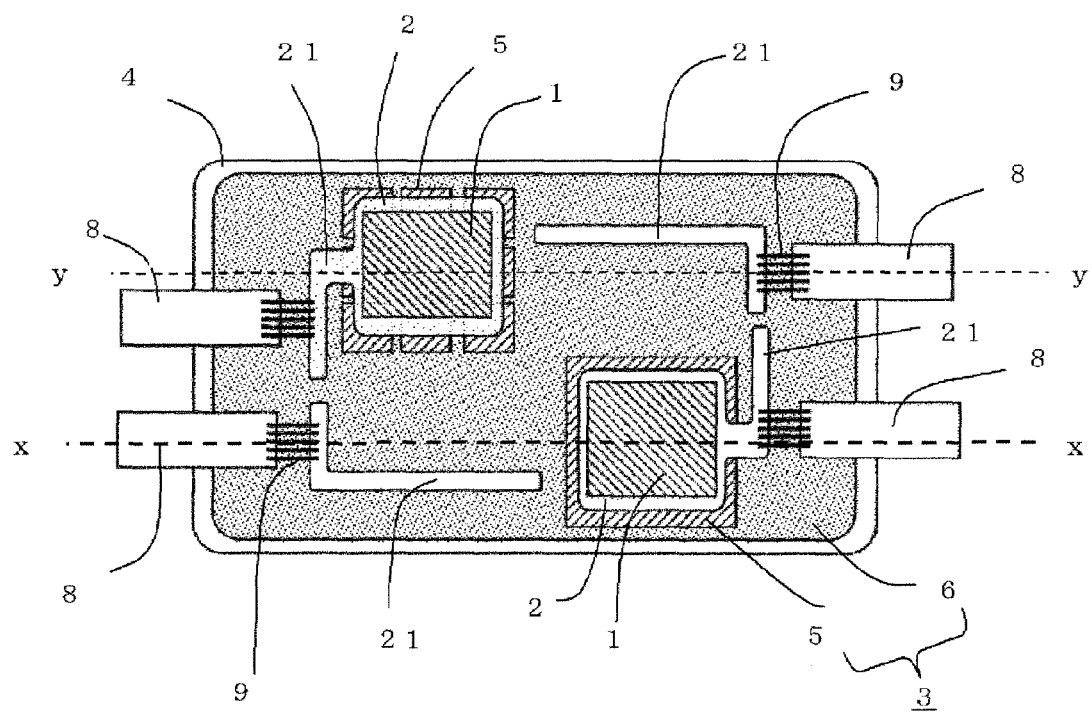
FIG. 1 is a top view illustrating a schematic configuration of a semiconductor device according to Embodiment 1 of the present invention.
Figure 2A:
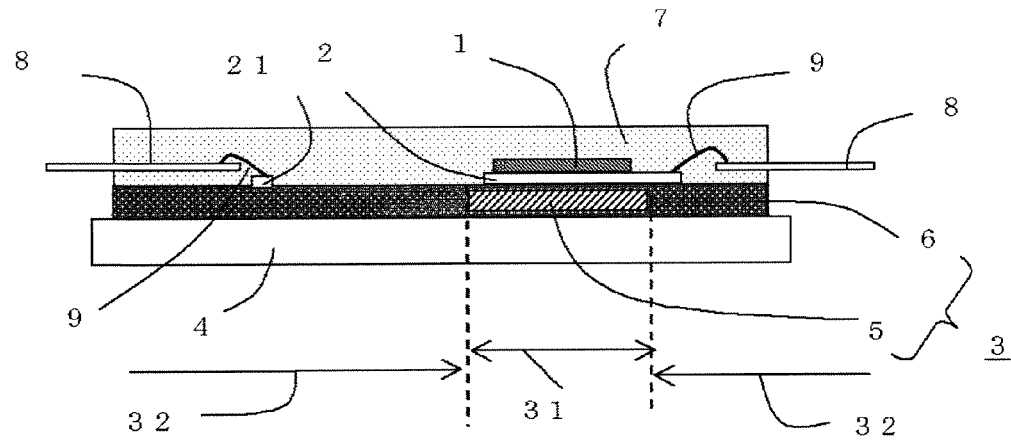
FIG. 2 is cross-sectional views of the semiconductor device illustrated in FIG. 1.
Figure 2B:
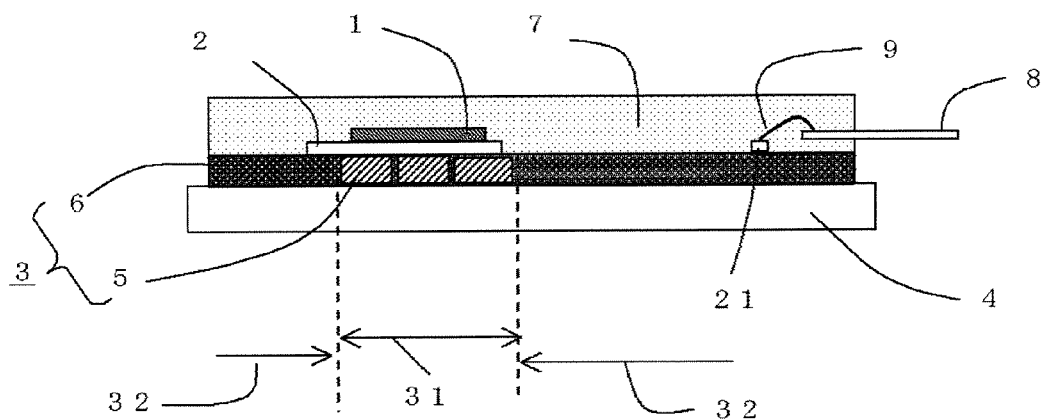

FIG. 1 is a top view illustrating a schematic configuration of a semiconductor device in Embodiment 1 according to the present invention, in which members are seen through thermal-conductive resin 6 provided on the surface of a thermal-conductive sheet 3; and FIG. 2 is cross-sectional views of the semiconductor device illustrated in FIG. 1, in which FIG. 2a is a cross-sectional view along x-x line in FIG. 1, and FIG. 2b is a cross-sectional view along y-y line in FIG. 1.

As represented in FIG. 1 and FIG. 2, in the semiconductor device according to this embodiment, a semiconductor chip 1 is mounted on a heat sink 2, and electrically connected to an external electrode 8 through a patterned electrode 21 connected to the heat sink 2 and through metal wires 9; moreover, the heat sink 2 and a base board 4 are united by the thermal-conductive sheet 3, and the semiconductor chip 1 is molded using mold resin 7.

In the thermal-conductive sheet 3 according to this embodiment, ceramic laminae 5 are embedded in the thermal-conductive resin 6, in which the ceramic laminae 5 are selectively embedded in a region on which the semiconductor chip 1 is mounted. That is, the thermal-conductive sheet 3 is configured of a ceramic-embedded region 31 where the ceramic laminae 5 are embedded, and a ceramic-non-embedded region 32 where the ceramic laminae 5 are not embedded; in which because the semiconductor chip 1 is mounted on the ceramic-embedded region 31, the generated heat of the semiconductor chip 1 can be effectively radiated.

Moreover, as described above, in the thermal-conductive sheet 3 according to this embodiment, not by evenly but by selectively embedding the ceramic laminae 5 into the thermal-conductive sheet 3, the producing cost can be decreased. Furthermore, because the difference in linear expansion coefficients between the ceramic lamina 5 and the base board 4, heat sink 2, or thermal-conductive resin 6 is relatively large, due to the heat generation of the semiconductor chip 1 or to the temperature variation of the usage environment, which gives the cause of warpage or peeling in the semiconductor device; however, in the thermal-conductive sheet 3 according to this embodiment, because of the ceramic-non-embedded region 32 where the ceramic laminae 5 are not embedded, the region in which the difference in linear expansion coefficients is relatively large decreases as described above, so that the warpage and the peeling can be prevented in the semiconductor device; consequently, the reliability is improved.

For example, the linear-expansion coefficient of the ceramic laminae 5 is about $1 \times 10^{-6}$/degree (° C.) when alumina is used as ceramic laminae 5, the linear-expansion coefficients of the base board 4 and the heat sink 2 are about $17 \times 10^{-6}$/degree (° C.) when copper is used as the base board 4 and the heat sink 2, and the linear-expansion coefficient of the thermal-conductive resin 6 is about $20 \times 10^{-6}$/degree (° C.) when composition of resin into which inorganic powder are filled is used as the thermal-conductive resin 6. Because the ceramic laminae 5 are embedded in the ceramic-embedded region 31, the linear-expansion coefficient of the ceramic-embedded region 31 is the almost same as the that of the ceramic laminae 5 and is remarkably different in comparison with the heat sink 2 of the upper layer and the base board 4 of the lower layer. Therefore, forming the thermal-conductive sheet 3 only of the ceramic-embedded region 31 causes a warpage or peeling in the semiconductor device due to heat generation of the semiconductor chip or to varying the temperature of the usage environment.

In the thermal-conductive sheet 3 according to this embodiment, the ceramic-embedded region 31 is adjacent to the ceramic-non-embedded region 32 where the ceramic laminae 5 are not embedded. Because the linear-expansion coefficient of the ceramic-non-embedded region 32 is larger than that of the ceramic-embedded region 31, it is possible to make the linear-expansion coefficient of the thermal-conductive sheet 3 to be about $20 \times 10^{-6}$/degree (° C.) and close to the linear-expansion coefficient of the heat sink 2 of the upper layer and the base board 4 of the lower layer. Accordingly, it is possible to conduct the heat of the semiconductor chip 1 through the ceramic-embedded region 31 and the warpage or peeling in the semiconductor device can be reduced.

Figure 3:
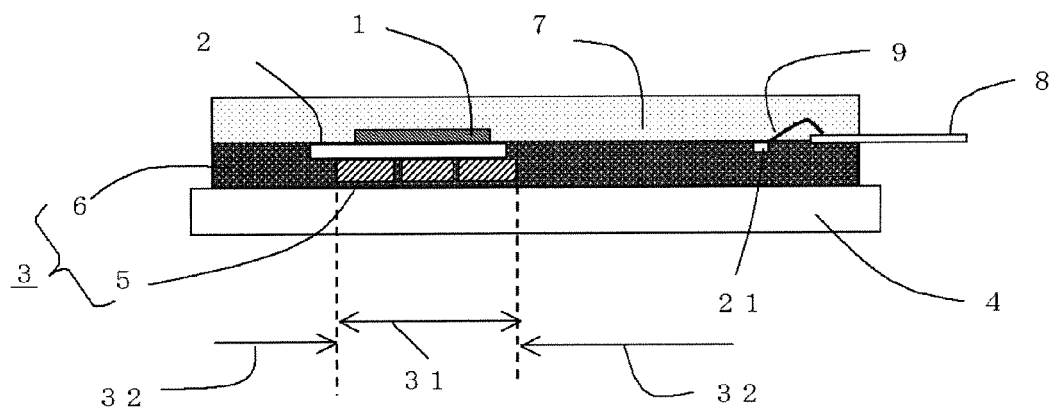
FIG. 3 is a cross-sectional view illustrating a schematic configuration of another semiconductor device according to Embodiment 1 of the present invention.

A case is represented in FIG. 1, in which the top face of the thermal-conductive resin 6 of the thermal-conductive sheet 3 contacts the bottom face of the heat sink 2; however, the invention is not limited to this case, but a structure may be applied in which the heat sink 2 and the base board 4 are adhered and fixed to each other using the thermal-conductive sheet 3, and as illustrated in FIG. 3, a structure may be also applied in which the top face of the thermal-conductive resin 6 of the thermal-conductive sheet 3 contacts the top face of the heat sink 2.

As the thermal-conductive resin 6 of the thermal-conductive sheet 3 according to this embodiment, resin having adhesive properties and thermal conductivity for enabling the thermal-conductive sheet 3 to unite the heat sink 2 and the base board 4 is used, in which thermal-conductive powders are filled in the resin composition.

As a resin component of the thermal-conductive resin 6, moldable resin such as epoxy resin, silicone resin, acrylic resin, or urethane resin is used; while as the thermal-conductive micro-particles, particles, such as ceramic micro-particles of alumina, silica, or boron nitride (BN), etc., diamond, or metal powders, whose thermal conductivity is higher than that of the resin component may be used. The particles whose shape is spherical are generally used; however, the invention is not limited to this shape, but particle-shaped, crash-shaped, or flake-shaped ones may also be used.

The ceramic laminae 5 of the thermal-conductive sheet 3 according to this embodiment are embedded in the thermal-conductive resin 6 at a region where the semiconductor chip 1 is mounted; thereby, the thermal conductivity of the thermal-conductive sheet 3 can be improved.

The ceramic laminae 5 are larger than the ceramic micro-particles of the thermal-conductive resin 6, and the plane size of the thermal-conductive sheet 3 being from 3 mm square to 25 mm square is preferably used. If the plane size is smaller than 3 mm square, the thermal resistance of the thermal-conductive sheet 3 increases, while if the plane size exceeds 25 mm square, according to a heat-cycle test a crack may easily occur in the ceramic laminae 5.

In FIG. 1, a case is represented in which the ceramic-embedded region 31 of the thermal-conductive sheet 3 on which the semiconductor chip 1 is mounted is configured by a single ceramic lamina 5 or by nine ceramic laminae 5; however, the invention is not limited to this configuration, but any number of the ceramic laminae 5 embedded in the ceramic-embedded region 31 may be used. Here, because the narrower the gap between the side faces of the respective ceramic laminae 5 in the ceramic-embedded region 31 of the thermal-conductive sheet 1, the more the thermal resistance decreases, this configuration is preferably used. However, when the gap is too narrow, the thermal-conductive resin 6 becomes difficult to penetrate between the side faces of the respective ceramic laminae 5, and voids remain; as a result, the deterioration of the insulation withstand voltage is concerned; and therefore, the gap distance is preferably set equal to or wider than 0.1 mm. However, because when the gap distance exceeds 3 mm, the thermal resistance tends to increase, the gap distance is preferably set in a range from 0.1 mm to 3 mm.

Figure 4A:
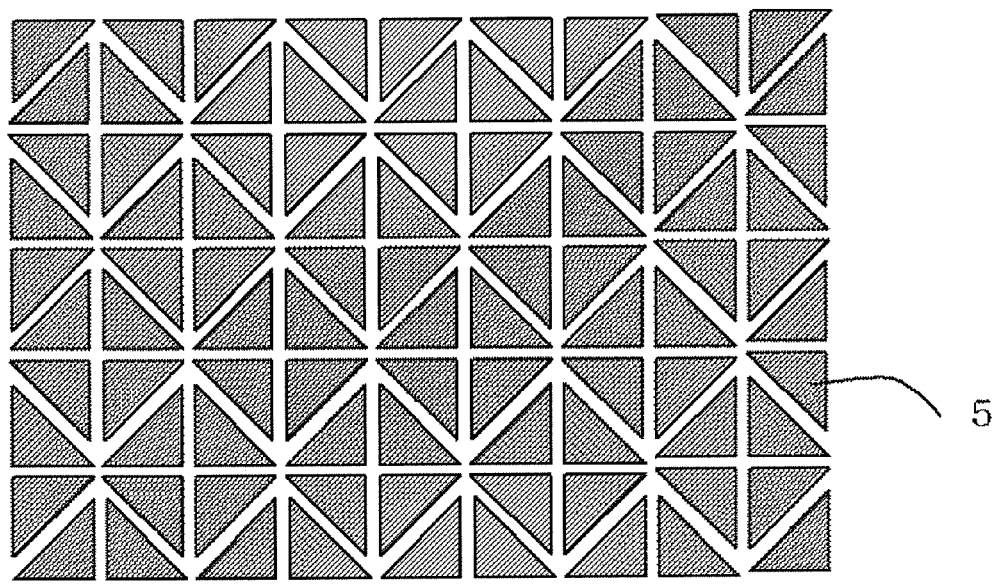
FIG. 4 is top views illustrating embedded states of ceramic laminae in ceramic-embedded regions of another thermal-conductive sheet according to Embodiment 1 of the present invention.

As the shape of the ceramic laminae 5, a square-pole one is generally used as illustrated in FIG. 1-FIG. 3; however, the invention is not limited to this shape. FIG. 4 is top views illustrating embedded states of the ceramic laminae 5 in the ceramic-embedded region 31 of another of the thermal-conductive sheet 3 according to this embodiment, in which ceramic laminae having a shape to be embedded in the thermal-conductive resin 6 may be used as the ceramic laminae 5; namely, a triangle-pole one as represented in FIG. 4a may be used, or a cylindrical one may also be used.

Figure 4B:
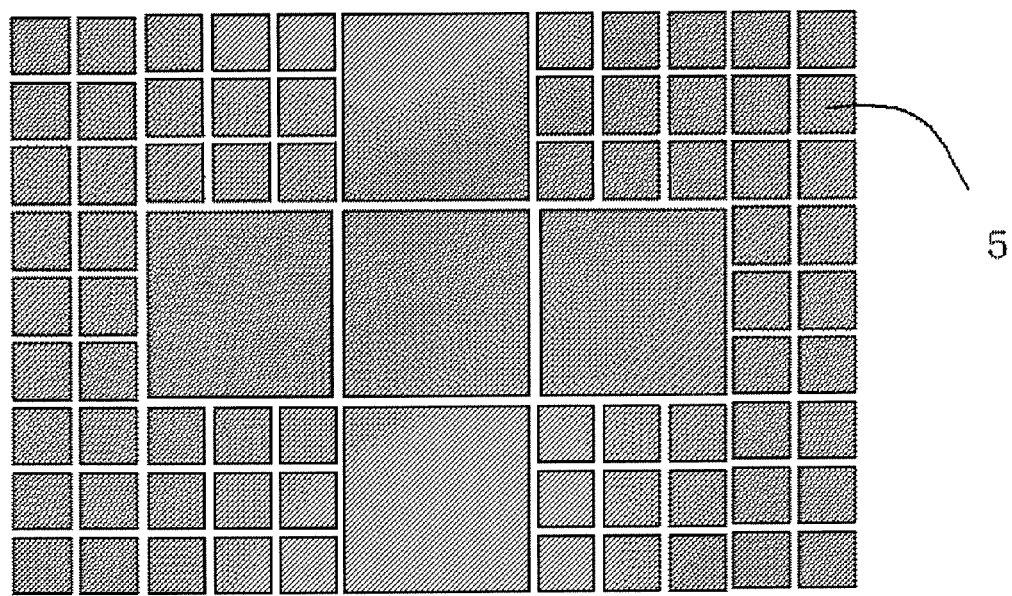

Moreover, in a case, as represented in FIG. 4b, in which the sizes of the ceramic laminae 5 in the ceramic-embedded region 31 are different from each other, it is effective that the warpage of the thermal-conductive sheet 3 is reduced.

Furthermore, as the ceramic laminae 5, ceramic material such as aluminum nitride (AlN), alumina, silica, silicon nitride (SiN), and boron nitride (BN) is used.

The semiconductor chip 1 according to this embodiment is a device that switches or amplifies electrical signals, and generally, a silicon device is used as the device; however, the invention is not limited to this device, but a device, using compound material such as GaAs, InP, or SiC, by which semiconductor characteristics can be obtained may be used.

Moreover, a case in which a single of the semiconductor chip 1 is mounted on the ceramic-embedded region 31 is represented in FIG. 1; however, a plurality of semiconductor chips may also be mounted.

The heat sink 2 according to this embodiment can be used as the patterned electrode, which can supply electric power into the semiconductor chip 1, and can be used as a wiring path for transmitting electrical signals from the semiconductor chip 1. Generally, copper is used as the material; however, the invention is not limited to this material, but material such as silver, aluminum, or gold may be used, gold or nickel plating, etc. on the surface of the metal may also be performed to prevent rust, or by providing irregularity on the surface of a portion where the thermal-conductive sheet contacts, the adhesive properties may also be improved.

Figure 5:
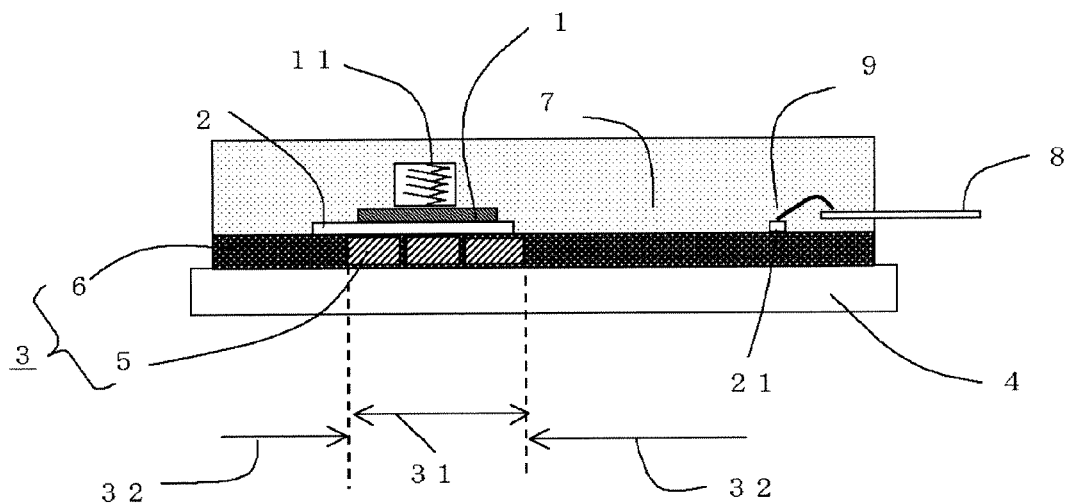
FIG. 5 is a cross-sectional view illustrating a state in which a semiconductor chip and a heat sink are connected and fixed to each other according to Embodiment 1 of the present invention.

Moreover, the semiconductor chip 1 is electrically connected and fixed to the heat sink 2 generally by using solder; however, the chip may be electrically connected and fixed to the heat sink 2 by suppression power obtained using a spring 11 as represented in FIG. 5.

The base board 4 according to this embodiment is a support for supporting the semiconductor chip 1, the heat sink 2, and the thermal-conductive sheet 3. Generally, a metal board such as a copper or aluminum board is used; however, the invention is not limited to the metal, but, for example, Al—SiC alloy may also be used, and composite material obtained by filling ceramic particles or glass fibers in resin may also be used.

Figure 6:
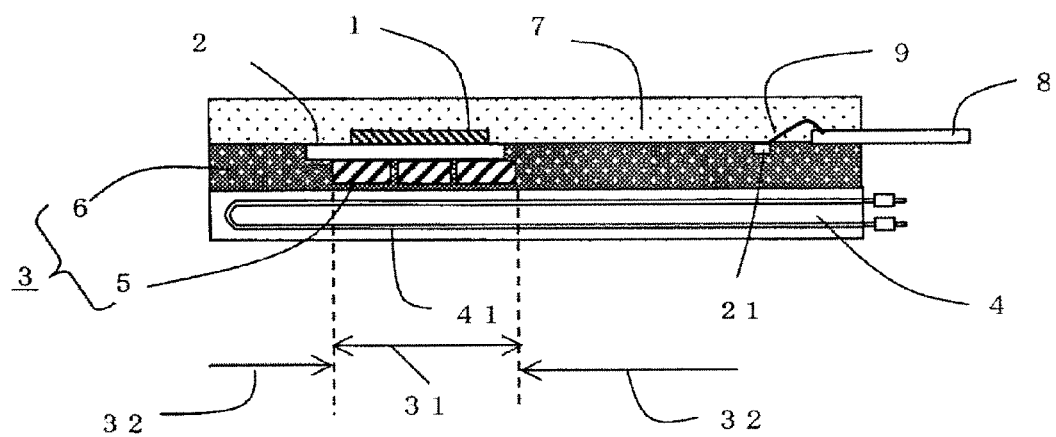
FIG. 6 is a cross-sectional view illustrating a state inside a base board according to Embodiment 1 of the present invention.

Moreover, in order to improve heat radiation characteristics, the base board 4 is generally fixed to a heat radiation fin; however, the invention is not limited to this configuration, but a cooling medium 41 may be made to flow inside the base board 4 as represented in FIG. 6; thereby, the cooling efficiency may be improved.

The mold resin 7 according to this embodiment is used for obtaining insulating properties of the semiconductor device, and resin into which insulation particles are filled is used. As the resin, thermosetting resin such as epoxy resin, acrylic resin, urethane resin or silicone resin, or thermoplastic resin such as PPS (poly(phenylene sulphide)), PET (poly(ethylene terephthalate)), or PE (polyethylene) is used, and any resin that can form an insulator may also be used. As the insulation particles, for example, particles of alumina, silica, silicone rubber, BN, or diamond are used, and as the particle shape, spherical ones are generally used; however, particle-shaped, crash-shaped, or flake-shaped ones may also be used.

Embodiment 2

As the thermal-conductive sheet 3 according to a semiconductor device in Embodiment 2 of the present invention, an epoxy resin sheet, whose plane size is 30 mm square, and in which 70 volume percent of $Al_2O_3$ is filled, is used. Here, in the sheet, the ceramic-embedded region 31 is configured in such a way that nine square ceramic laminae 5 (AlN) whose thickness and plane size are listed in Table 1 are embedded, at the center of the sheet, with each gap distance between the side faces being set at 1 mm. A square copper plate whose plate size is 25 mm square is used as the heat sink 2, on which the semiconductor chip 1 whose plate size is 10 mm square is mounted, and a rectangular copper plate whose thickness is 4 mm, and whose plate sizes are 50 mm and 100 mm is used as the base board 4; then, using the thermal-conductive sheet 3, the base board 4 and the heat sink 2 on which the semiconductor chip 1 is mounted are adhered and united in such a way that the semiconductor chip 1 is mounted on the ceramic-embedded region 31; and thus, the semiconductor device according to this embodiment was obtained. Here, the thermal-conductive sheet 3 having a predetermined thickness can be obtained by adjusting the thickness of the epoxy-resin sheet using the ceramic laminae 5 whose thickness is listed in Table 1.

Using the semiconductor device according to this embodiment, radiation characteristics of heat generated from the semiconductor chip and warpage of the semiconductor device were measured at an atmospheric temperature of 25 degrees.

The thickness of each thermal-conductive sheet 3 according to this embodiment, the thickness and the square size of the ceramic laminae 5, the square size of the semiconductor chip 1, and the heat-generation amount are listed in Table 1.

TABLE 1

| | Thermal-conductive sheet | | | | |
|---|---|---|---|---|---|
| | p | q | r | s | t |
| Sheet thickness (μm) | 400 | 400 | 400 | 500 | 600 |
| Ceramic-lamina thickness (μm) | 350 | 200 | 100 | 350 | 350 |
| Ceramic-lamina square size (mm) | 3 | 3 | 3 | 3 | 3 |
| Semiconductor-chip square size (mm) | 10 | 10 | 10 | 10 | 10 |
| Semiconductor-chip heat-generation amount (W) | 10 | 10 | 10 | 10 | 10 |

Figure 7A:
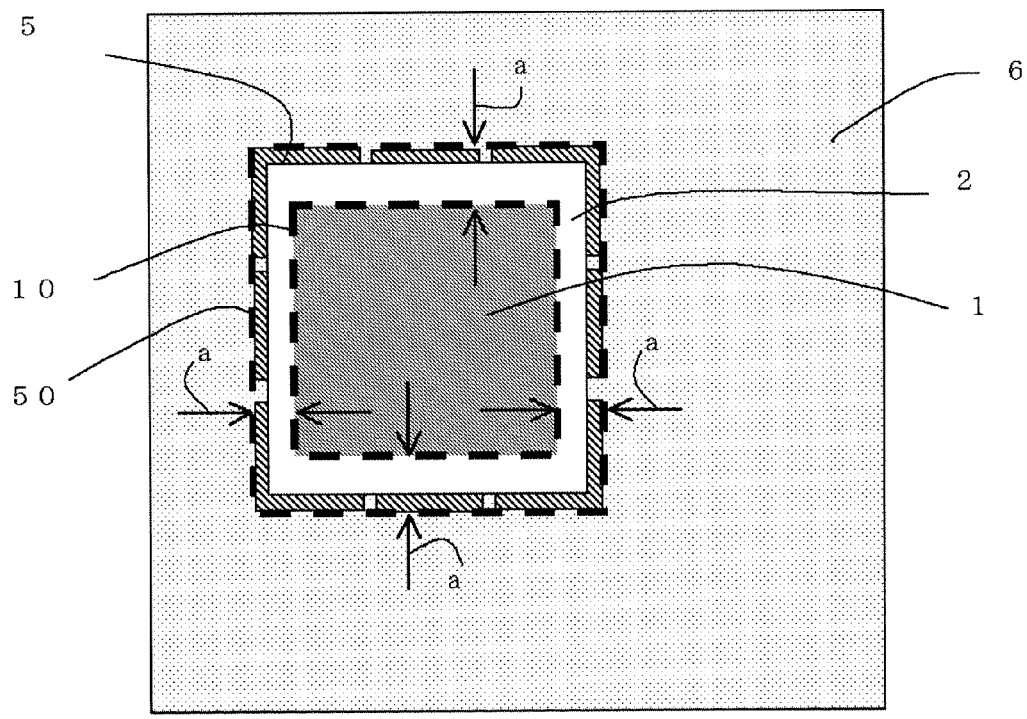
FIG. 7 is explanatory views for explaining a method of measuring radiation characteristics of heat generated from the semiconductor chip, and a method of measuring warpage of the semiconductor device according to Embodiment 1 of the present invention.
Figure 7B:
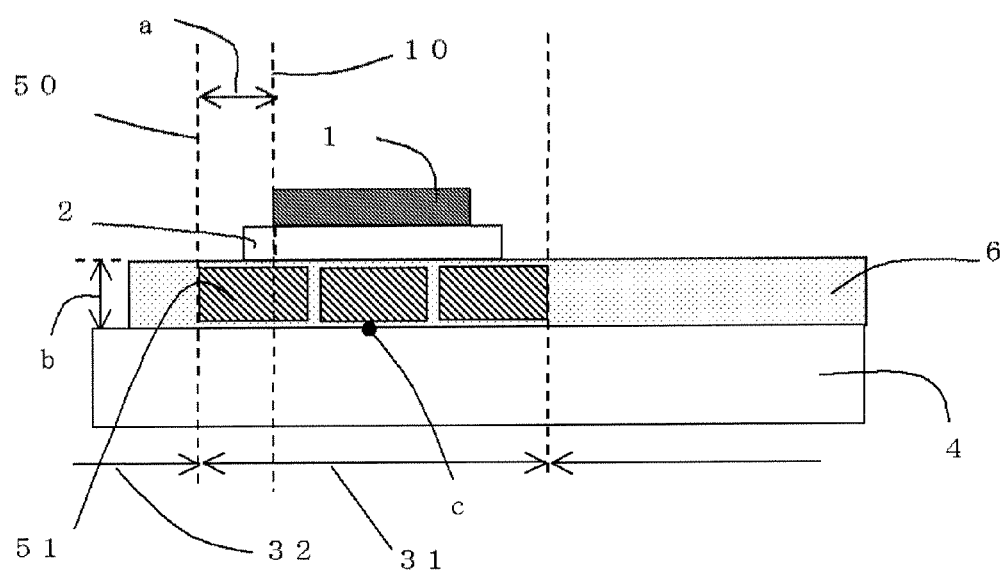

FIG. 7 is explanatory views for explaining a method of measuring the radiation characteristics of heat generated from the semiconductor chip in the semiconductor device according to this embodiment, in which FIG. 7a is a top view illustrating the periphery of the ceramic-embedded region 31 of the semiconductor device according to this embodiment, that is, a top view illustrating members that are seen through the thermal-conductive resin provided on the surface of the thermal-conductive sheet 3, and FIG. 7b is a cross-sectional view along z-z line in FIG. 7a.

That is, in the ceramic-embedded region 31 on which the semiconductor chip 1 is mounted, the gap distance a (μm) between a first face 10 including the perimeter face of the semiconductor chip 1 and a second face 50 including the outer perimeter face of a ceramic lamina 51 located at the perimeter of the ceramic-embedded region 31 was measured. FIG. 7 represents a case in which the gap distance a varies with each perimeter face of the semiconductor chip; however, in this embodiment, in order to clarify the present invention, a semiconductor device was used in which the gap distance a is configured so as to be the same value at all perimeters of the semiconductor chip 1.

The radiation characteristics of the thermal-conductive sheet 3 was measured by measuring the surface temperature, of a point (point "c") at the bottom-center of the semiconductor chip, at the side-surface of the thermal-conductive sheet 3 provided on the base board 4, as represented in FIG. 7.

Moreover, the warpage of the semiconductor device caused by the heat generated from the semiconductor chip was measured, by measuring the height of the base board set on a plate using a three-dimensional shape measurement apparatus, in such a way that the difference between the maximum height and the minimum height is assumed to be the warpage.

Figure 8:
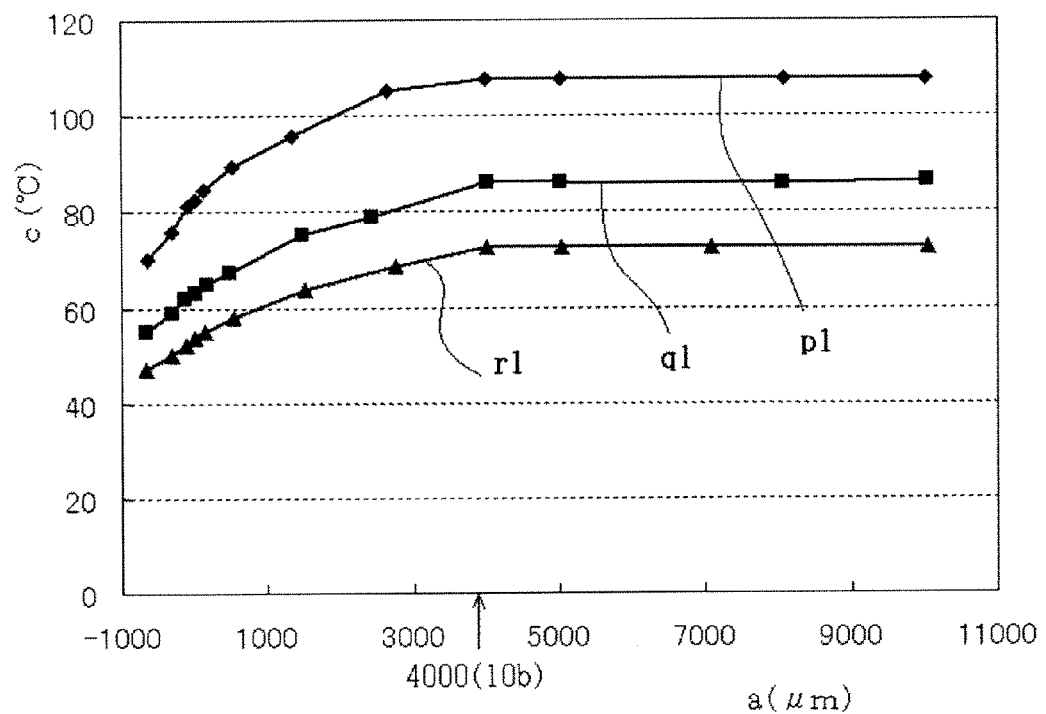
FIG. 8 is a characteristic view representing correlations between gaps a and temperatures at a point "c" according to Embodiment 2 of the present invention.
Figure 9:
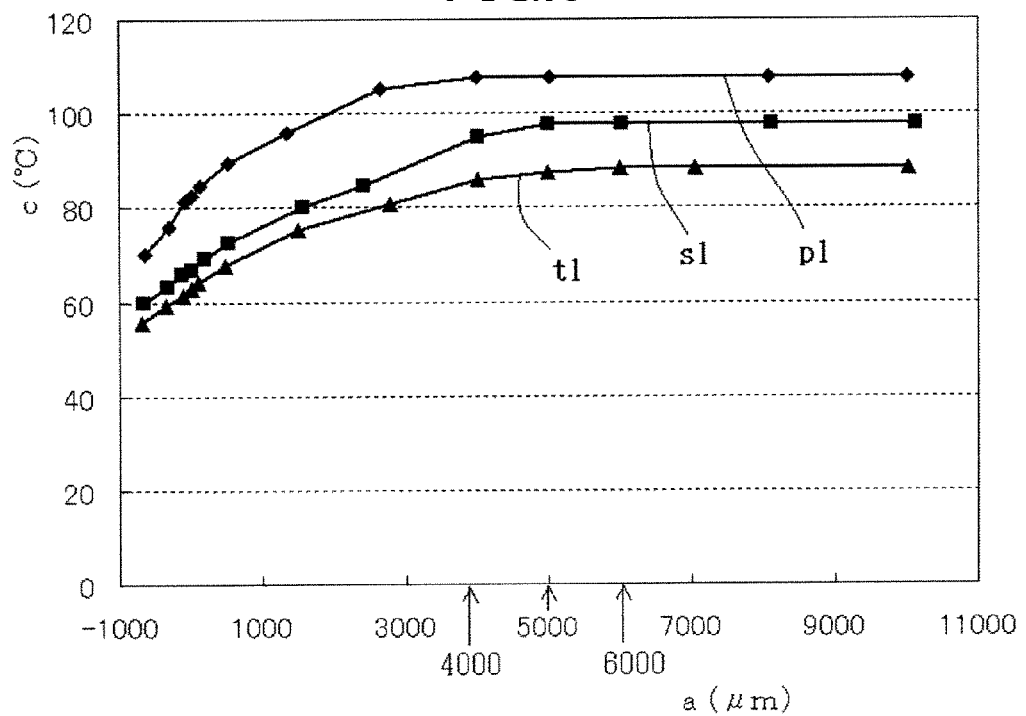
FIG. 9 is a characteristic view representing correlations between the gaps a and the temperatures at the point "c" according to Embodiment 2 of the present invention.

FIG. 8 and FIG. 9 are characteristic views representing correlations between the gaps a measured as above and the temperatures at the point "c", in which curves "p1", "q1", and "r1" in FIG. 8 represent heat radiation characteristics when the sheet-thickness b of the thermal-conductive sheet 3 is set constant (400 μm), and each thickness of the ceramic laminae 5 is set 350 μm, 200 μm, and 100 μm, respectively, and in which curves "p1", "s1", and "t1" in FIG. 9 represent heat radiation characteristics when the thickness of the ceramic lamina is set constant (350 μm), and each sheet thickness is set 400 μm, 500 μm, and 600 μm, respectively.

As represented in FIG. 8 and FIG. 9, when the gap a moves to a negative region, the heat-radiation characteristics are observed to decrease drastically and in order to ensure excellent heat-radiation characteristics, the gap a is required not to be negative; that is, it is understood to be preferable that the size of the ceramic-embedded region 31 is larger than that of the face on which the semiconductor chip 1 is mounted.

As represented in FIG. 8, until the gap a is ten times the thickness b (400 μm) of the thermal-conductive sheet 3 (400 μm×10), the wider the gap a, the temperature at the point "c" becomes higher, and thus the heat radiation characteristics is improved; however, when the gap a exceeds ten times the thickness b of the thermal-conductive sheet 3, the temperature at the point "c" becomes approximately constant.

Moreover, as represented in FIG. 9, in a case in which the thickness b of the thermal-conductive sheet 3 is 400 μm, 500 μm, and 600 μm, similarly to FIG. 8, when the gap a exceeds ten times the thickness b of the thermal-conductive sheet 3, the temperature at the point "c" is also found to become approximately constant.

Figure 10:
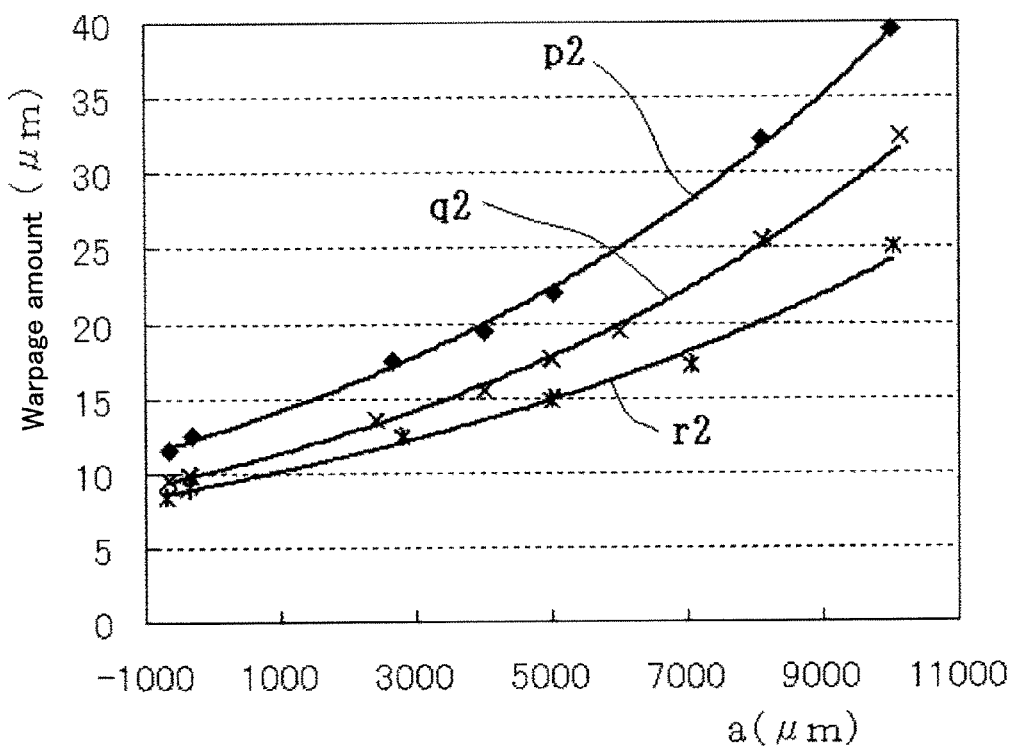
FIG. 10 is a characteristic view representing correlations between the gaps a and warpage amounts according to Embodiment 2 of the present invention.
Figure 11:
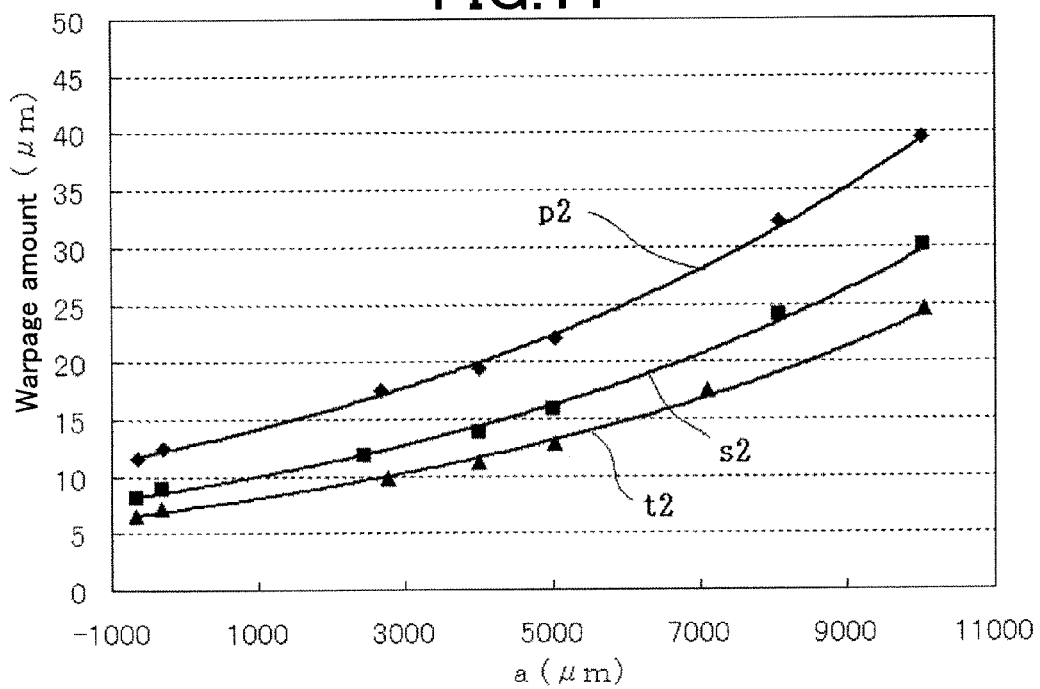
FIG. 11 is a characteristic view representing correlations between the gaps a and the warpage amounts according to Embodiment 2 of the present invention.

FIG. 10 and FIG. 11 are characteristic views representing correlations between the gaps a measured as above and warpage amounts of the semiconductor device, in which curves "p2", "q2", and "r2" in FIG. 10 represent warpage characteristics when the sheet-thickness b of the thermal-conductive sheet is set constant (400 μm), and each thickness of the ceramic laminae is set 350 μm, 200 μm, and 100 μm, respectively, and in which curves "p2", "s2", and "t2" in FIG. 11 represent warpage characteristics when the thickness of the ceramic laminae 5 of the thermal-conductive sheet 3 is set constant (350 μm), and each sheet thickness of the thermal-conductive sheet 3 is set 400 μm, 500 μm, and 600 μm, respectively.

As FIG. 10 and FIG. 11, when the gap a increases, the warpage of the semiconductor device is found to increase, while, when the gap a decreases, the warpage is found to correspondingly decrease. When the warpage of the semiconductor device increases, peeling of the heat sink 2 becomes easy to occur when heat generates in the semiconductor chip 1, or to occur depending on the usage environment.

Figure 12:
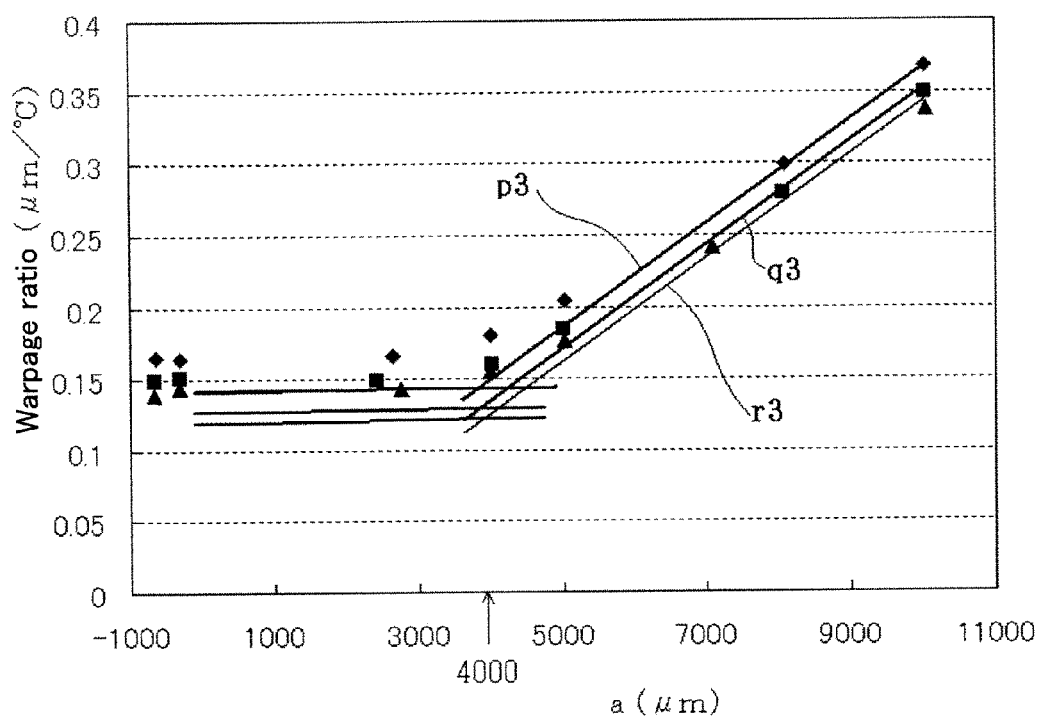
FIG. 12 is a characteristic view representing correlations between the gaps a and warpage ratios according to Embodiment 2 of the present invention.
Figure 13:
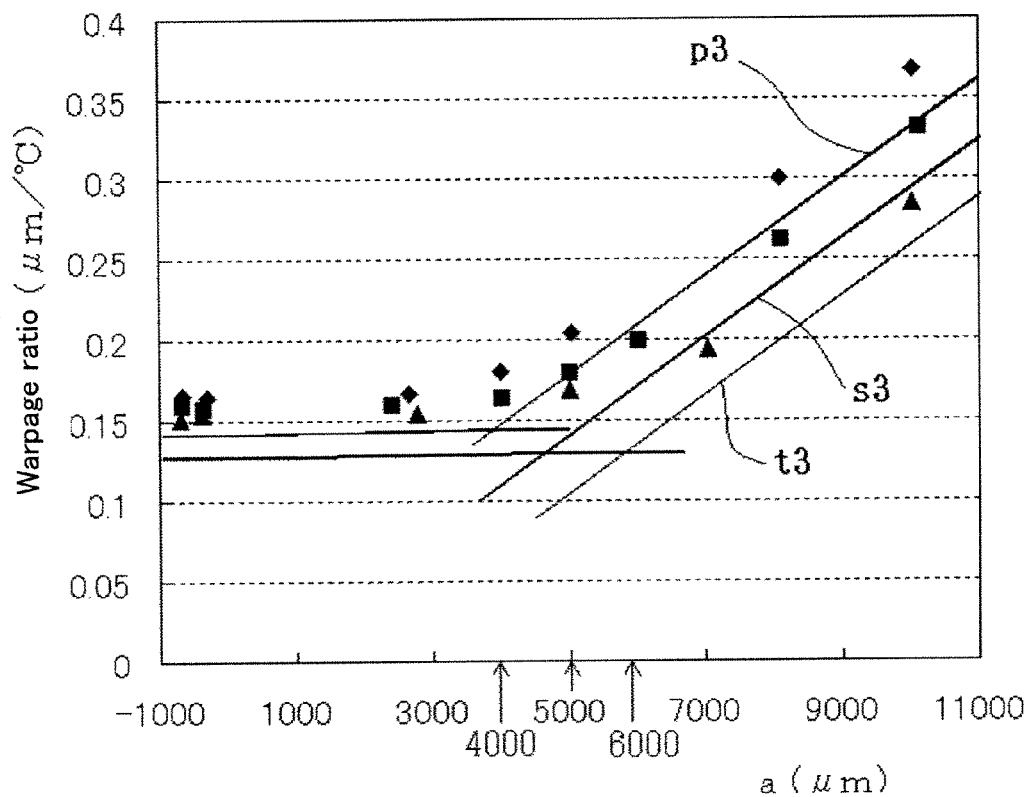
FIG. 13 is a characteristic view representing correlations between the gaps a and the warpage ratios according to Embodiment 2 of the present invention.

FIG. 12 and FIG. 13 are characteristic views representing relationship between the gaps a described as above and warpage amounts each in response to the temperature at the point "c" (warpage ratios) (μ/degree), in which lines "p3", "q3", and "r3" in FIG. 12 represent warpage characteristics when the sheet-thickness b of the thermal-conductive sheet is set constant (400 μm), and each thickness of the ceramic laminae is set 350 μm, 200 μm, and 100 μm, respectively, and in which lines "p3", "s3", and "t3" in FIG. 13 represent warpage-ratio characteristics when the thickness of the ceramic lamina 5 of the thermal-conductive sheet 3 is set constant (350 μm), and each thickness of the thermal-conductive sheets 3 is set 400 μm, 500 μm, and 600 μm, respectively.

As represented in FIG. 12, until the gap a is ten times the thickness b (400 μm) of the thermal-conductive sheet 3 (400 μm×10), the warpage amount in response to the temperature at the point "c" is constant; however, when the the gap a exceeds ten times the thickness b of the thermal-conductive sheet 3, the warpage amount in response to the temperature at the point "c" drastically increases.

Moreover, as represented in FIG. 13, in a case in which the thickness b of the thermal-conductive sheet 3 is 400 μm, 500 μm, and 600 μm, a tendency similar to that in FIG. 12 can also be obtained.

As described above, by providing the ceramic-embedded region 31 in the thermal-conductive sheet 3 in such a way that the gap a is set $0 \leq a \leq 10\,b$, and by mounting the semiconductor chip 1 on the ceramic-embedded region 31, the warpage of the semiconductor device can be reduced with ensuring sufficient heat-radiation characteristics, and the peeling of the heat sink 2 due to the heat generation of the semiconductor chip 1 or to the environmental temperature can be suppressed; as a result, reliability thereof is found to be improved.

Moreover, by selecting the region in the thermal-conductive sheet 3, and by embedding the ceramic laminae 5 in the region, the heat-radiation characteristics of the thermal-conductive sheet is improved without excessively using the ceramic laminae 5, and the manufacturing cost can also be reduced.

Figure 14:
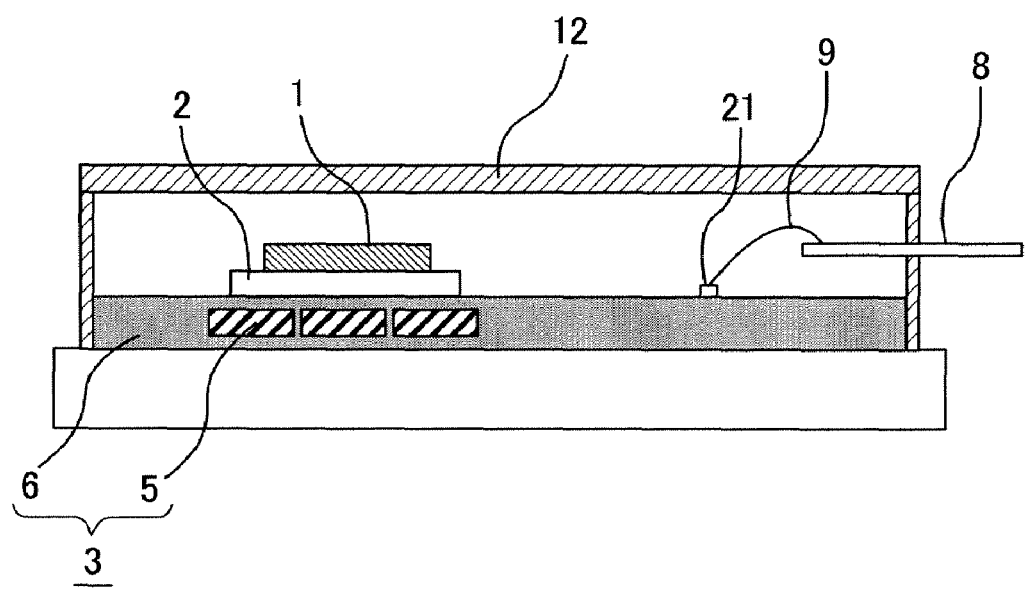
FIG. 14 is a cross-sectional view of a semiconductor device according to Embodiments of the present invention.

In each embodiment, an example in which the semiconductor chip is molded using the mold resin has been explained; however, the invention may also be applied to a case in which the chip is not molded using mold resin, for example, as represented in FIG. 14. In FIG. 14, numeral 12 denotes a case. In this manner, the electrical parts such as the semiconductor chip 1 may be protected from the external environment by covering with the case 12, without the semiconductor chip 1 being molded by resin, etc.

Moreover, in the above each embodiment, an example is represented in which a lamina is used as the ceramic component; however, another shaped one such as a cylindrical shaped one other than the plate-like shaped one may be used as the ceramic component. Furthermore, regarding the shape of the heat sink, in order to effectively conduct heat from the semiconductor chip, the faces of the semiconductor-chip side and the opposite side (base-board side) are preferably configured to be flat.

As described above, Embodiments according to the present invention have been explained referring to the figures; however, specific configurations are not limited to these embodiments, but the invention may include other configurations without departing from the scope of the invention.

What is claimed is:

1. A semiconductor device comprising:
   a base board;

a thermal-conductive sheet formed on the base board, including thermal-conductive resin;

a heat sink provided on the base board through the thermal-conductive sheet;

a semiconductor chip mounted on the heat sink; and a ceramic-embedded region selectively provided in a region of the thermal-conductive sheet under the semiconductor chip, including a ceramic component.

2. A semiconductor device as recited in claim 1, wherein the ceramic-embedded region is provided close to a ceramic-non-embedded region in which a linear expansion coefficient thereof is larger than that in the ceramic-embedded region of the thermal-conductive sheet.

3. A semiconductor device as recited in claim 1, wherein the ceramic-embedded region is adjacent to a ceramic-non-embedded region where the ceramic component are not embedded.

4. A semiconductor device as recited in claim 1, wherein the ceramic-embedded region is provided only in a region under the semiconductor chip.

5. A semiconductor device as recited in claim 1, wherein the ceramic component has a flat portion at each side of the semiconductor chip and the base board.

6. A semiconductor device as recited in claim 1, wherein the ceramic component is thin plate-like shaped.

7. A semiconductor device as recited in claim 1, wherein a plurality of ceramic components is provided in the ceramic-embedded region, and the thermal-conductive resin intervenes between the ceramic components.

8. A semiconductor device as recited in claim 7, wherein the plurality of ceramic components include components whose sizes are different from each other.

9. A semiconductor device as recited in claim 7, wherein the plurality of ceramic components are arranged to each other with a gap therebetween being 0.1 mm-3 mm.

10. A semiconductor device as recited in claim 1, wherein the relationship between a gap a, between a first face including the peripheral face of the semiconductor chip and a second face including the outer peripheral face of the ceramic component provided at the peripheral portion of the ceramic-embedded region, and a thickness b of the thermal-conductive sheet is:

$0 \leq a \leq 10\,b.$

11. A semiconductor device as recited in claim 1, further comprising mold resin for molding the semiconductor chip.

* * * * *